United States Patent [19]
Kempf et al.

[11] Patent Number: 6,054,029
[45] Date of Patent: Apr. 25, 2000

[54] DEVICE FOR GRIPPING, HOLDINGS AND/OR TRANSPORTING SUBSTRATES

[75] Inventors: Stefan Kempf, Alzenau-Albstadt; Eggo Sichmann, Geinhausen, both of Germany

[73] Assignee: Singulus Technologies GmbH, Alzenau, Germany

[21] Appl. No.: 08/803,842

[22] Filed: Feb. 24, 1997

[30] Foreign Application Priority Data

Feb. 23, 1996 [DE] Germany .............................. 196 06 763
Feb. 23, 1996 [DE] Germany .............................. 196 06 764

[51] Int. Cl.[7] ................................................. C23C 14/34
[52] U.S. Cl. ............................... 204/298.25; 204/298.15; 204/298.23; 204/298.28; 118/729; 414/223
[58] Field of Search ................... 204/298.25, 298.28, 204/298.15, 298.23; 118/728, 729, 719, 733; 414/223, 935

[56] References Cited

U.S. PATENT DOCUMENTS

| 4,915,564 | 4/1990 | Eror et al. ................................. 414/217 |
| 5,112,469 | 5/1992 | Kempf et al. ....................... 204/298.25 |
| 5,288,379 | 2/1994 | Namiki et al. ...................... 204/192.12 |
| 5,407,314 | 4/1995 | Kempf .................................... 414/217 |
| 5,518,599 | 5/1996 | Schwartz et al. ................... 204/298.25 |
| 5,611,861 | 3/1997 | Higashi ................................... 118/719 |
| 5,612,068 | 3/1997 | Kempf et al. ............................ 425/574 |
| 5,662,785 | 9/1997 | Schertler ............................ 204/298.25 |
| 5,692,873 | 12/1997 | Weeks et al. ........................... 414/627 |
| 5,709,785 | 1/1998 | LeBlanc, III et al. ............. 204/298.25 |

OTHER PUBLICATIONS

Singulus "A Family of Single Disc Metallizing Systems"—Product Brochure (No Date).
Singulus 11/1.8—"The 1.8 Second Metallizer for Compact Discs"—Product Brochure (No Date).

*Primary Examiner*—Nam Nguyen
*Assistant Examiner*—Julian A. Mercado
*Attorney, Agent, or Firm*—Pillsbury Madison & Sutro

[57] ABSTRACT

Apparatus 1 for gripping, holding and/or transporting substrates 2, components of which are an entry station 3 and several processing station 4 to 9 arranged in series or in a circle for receiving the substrate 2, to which the substrate 2 is passed on by means of a transporting device 1 disposed on gripper arms 13 and having gripper elements 24, or a turntable 12, and subsequently is deposited in one or several deposit stations 14, wherein several gripper arms 13 can be shifted in the horizontal and/or vertical direction by means of the turntable 12. Some of the gripper elements 24 can be shifted together in the horizontal or vertical direction by means of the turntable 12 and at least one gripper arm 13' can be shifted in at least one of the movement directions independently of the remaining gripper arms 13.

23 Claims, 3 Drawing Sheets

DEVICE FOR GRIPPING, HOLDINGS AND/OR TRANSPORTING SUBSTRATES

BACKGROUND OF THE INVENTION

1. Field of the Invention

The invention relates to a device for gripping, holding and/or transporting substrates, components of which device are an entry station and several processing stations arranged in series or in a circle for receiving the substrate, to which the substrate is passed on by means of a transporting device disposed on gripper arms and having gripper elements, or a turntable, and subsequently is deposited in one or several receiving stations, wherein several gripper arms can be shifted in the horizontal and/or vertical direction by means of the turntable.

2. Prior Art

A device for gripping and holding or transporting substrates is already known, part of which device is an entry station through which the substrate is brought into the installation. Several processing stations, which are arranged in series or in a circle adjoin this entry station, and are approached by means of gripper arms which receive the substrates. The gripper arms must be lifted between the respective individual positions in order to bring them from one position to the next position. Up to now, such shifting took place by means of individual pneumatic cylinders, an arrangement which is very elaborate and expensive, since every gripper arm must be separately controlled, in particular since the gripper arm for filling the lock is shifted independently of the remaining gripper arms in order to assure that during entry into the lock the vacuum pressure is maintained in the lock for a defined period of time.

SUMMARY OF THE INVENTION

In contrast to this it is an object of the invention to embody the drive mechanism for the individual gripper arms in a more cost-efficient manner and to simplify the control of the individual gripper arms.

This object is attained in accordance with the invention in that a number of gripper arms can be shifted together in the horizontal and/or vertical direction by means of the turntable, and at least one gripper arm can be shifted in at least one of the movement directions independently of the remaining gripper arms. By means of the advantageous embodiment and arrangement of the individual gripper arms it is possible for the first time to shift all gripper elements except for one, which is associated with a cathode, so that it is possible to omit individual shifting of the gripper arms customary up to now. This is achieved in particular in that the gripper arm associated with the cathode can be individually shifted by the lifting device of the remaining gripper arms. Thus, if in the first position or transfer position of the substrate between the gripper element and the lock of the coating installation the substrate is placed into the lock, the lid disposed on the gripper arm can be set on the lock chamber in a vacuum-tight manner and the plate can be shifted upward by being uncoupled from the gripper arm, wherein the differential pressure $P_d = P_a - P_v$ maintains the plate on the lock. The plates and gripper elements, which are fixedly connected with the gripper arms, are upwardly shifted on the individual work positions by the lifting process after the substrates have been released, so that the substrates can be moved from this corresponding position into their respective work position. In the course of this work step, the substrate exchange in the entry position between the receiver element and the gripper element of the first gripper arm is not hampered. When the lock is flooded, the plate can again be moved upward on an appropriate device, so that the gripper arm can again be brought back into its base or entry position.

It is advantageous in connection with this that the one or first gripper element can be shifted at least in a vertical movement direction independently of the remaining gripper arms or gripper elements.

It is also advantageous that a gripper element can be shifted in at least one horizontal movement position independently of the other gripper elements and/or gripper arms whose plane of movement or movement direction extends approximately parallel with the plane of movement or surface of the turntable or the base of the device, or intersects the axis of rotation of the turntable at approximately right angles.

It is furthermore advantageous that the one or the first gripper element can be shifted at least in the direction of the lifting movement of the gripper arm independently of the lifting movement of the gripper arm, and that in the course of a lifting movement of the gripper arm, the gripper element with the associated cover is maintained on the chamber or receptacle cover located above the substrate holder by means of a differential pressure $P_d$ being built up in the lock chamber, and the substrate picked up from the turntable is moved on into the cathode. By decoupling the gripper element and the associated cover at the first gripper arm, the latter permits a lifting movement over the turntable together with the other gripper arms, without the lock chamber being flooded by this, because the first plate remains seated on the lock chamber opening. It is possible by means of this to save drive elements, hydraulic cylinders in particular, for shifting the individual gripper arms.

In accordance with a preferred embodiment of the invention, it is finally provided that the substrate holder or cover can be shifted in one direction by means of the differential pressure $P_a$ and in the other direction by means of the actuating power of a pressure medium or a spring, and the other substrate holders or covers can be shifted together in at least one direction by means of a turntable, which is connected with the actuating element or the actuating cylinder.

It is of particular importance for the instant invention that the first substrate holder or cover can be shifted by means of a lifting device which is part of a piston guided in a cylinder which houses the spring and which is connected with the cover or substrate holder. By employing the differential pressure, which retains the plate of the first gripper arm in the lower position until the lock can be flooded, an additional driving means or an adjustment cylinder can be omitted.

In connection with an arrangement in accordance with the invention, it is advantageous that the substrate holder or cover can be shifted by means of at least two lifting devices, which pull the substrate holder or the cover in the direction of the gripper arm, and that the substrate holder or cover has at least one sensor for detecting the substrate.

Further advantages and details are explained in the description below and are illustrated in the drawing.

DETAILED DESCRIPTION OF THE PREFERRED EMBODIMENTS

Figure 1:
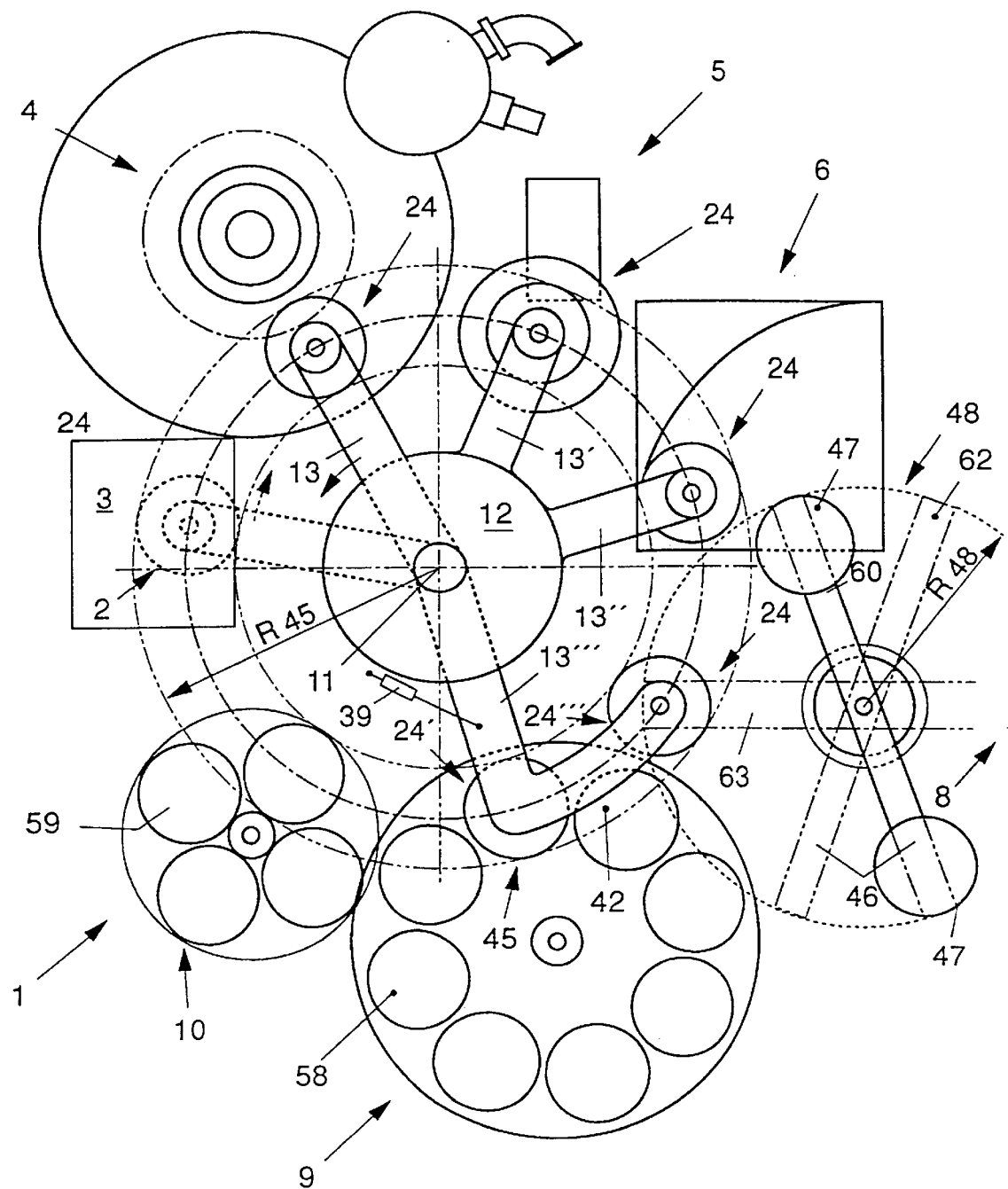
FIG. 1 is a schematic top plan view of a compact disc (CD) production installation according to the invention.

As can be seen in FIG. 1, a plurality of substrates, e.g., CDs, 2 are moved forward by means of a device 1 for gripping and holding and/or transporting the substrates. Each substrate 2 is picked up in the area of an entry station or transfer station 3 by a substrate gripping device 24 carried by a gripper arm 13 which is shifted in a counterclockwise direction about an axis 11 to a position shown in broken lines, and are then passed on by it in a clockwise direction to a first processing station or vacuum, or sputtering, coating device 4, of which a cathode, not shown in the drawings, is a part. The vacuum coating, or sputtering, can be constituted, for example, by a system marketed by Singulus Technologies GmbH of Alzenau, Germany, under the model designation SINGULUS III. The gripper arm 13 is fixedly arranged on a turntable 12, along with other gripper arms 13', 13", 13'". Each of the gripper arms 13, 13', 13" has a substrate gripping device 24. The gripper arm 13'" is equipped with two gripping devices 24', 24'".

The second gripper arm 13', which is fixedly connected with the turntable 12, can pick up the coated substrate 2 at the processing station 4 by means of the substrate gripping device 24 after the turntable 12 has been shifted in a counterclockwise direction, and by further movement of the turntable 12 in a clockwise direction can bring it to the processing station 5, in which the substrate 2 is coated with lacquer. The coated or lacquered substrate 2 is picked up at the processing station 5 by the gripper arm 13", which is also shifted in a counterclockwise direction to do this, and brought to a further processing station 6, namely a lacquer drying device. To do this the gripper arm 13" is first moved to station 5, picks up the substrate 2 and then pivots back to station 6 again, from which the substrate 2 reaches the lacquer drying device at station 6. From the processing station 6 (lacquer drying), the substrate 2 reaches a checking or scanning position 7 by means of the gripper arm 13'". For this purpose gripper arm 13'", having an L-shape, is pivoted in a counterclockwise direction by means of the turntable 12, so that the substrate gripping device 24'" can pick up substrate 2 at the position 6 and then shift it to the checking or scanning position 7.

As already mentioned, the position 7 represents a checking or dual inspection device, with which a printing station 8 is associated.

The substrate 2 can be scanned on the top and underside by means of the dual inspection device 7 and the lacquering and printing quality can be monitored in this way, i.e. all defects can be detected, for example scratches which have occurred during printing.

It can also be determined whether the disk quality is acceptable, for which purpose the CDs can also be scanned from the bottom. The particularity of this inspection is that the CDs, which had already been previously scanned, can now again be checked after the printing process for defects which have occurred during the printing process. It is therefore also possible to make a quick check of the faultless operation of the printer.

Following the dual inspection at the processing station 7, the substrate 2 is passed on by means of gripping device 24' on the L-shaped gripper arm 13'" to a first delivery station 9 for faultless, or acceptable, CDs, or to a second delivery station 10 for CDs which were sorted out, i.e. have a lower quality.

Figure 2A:
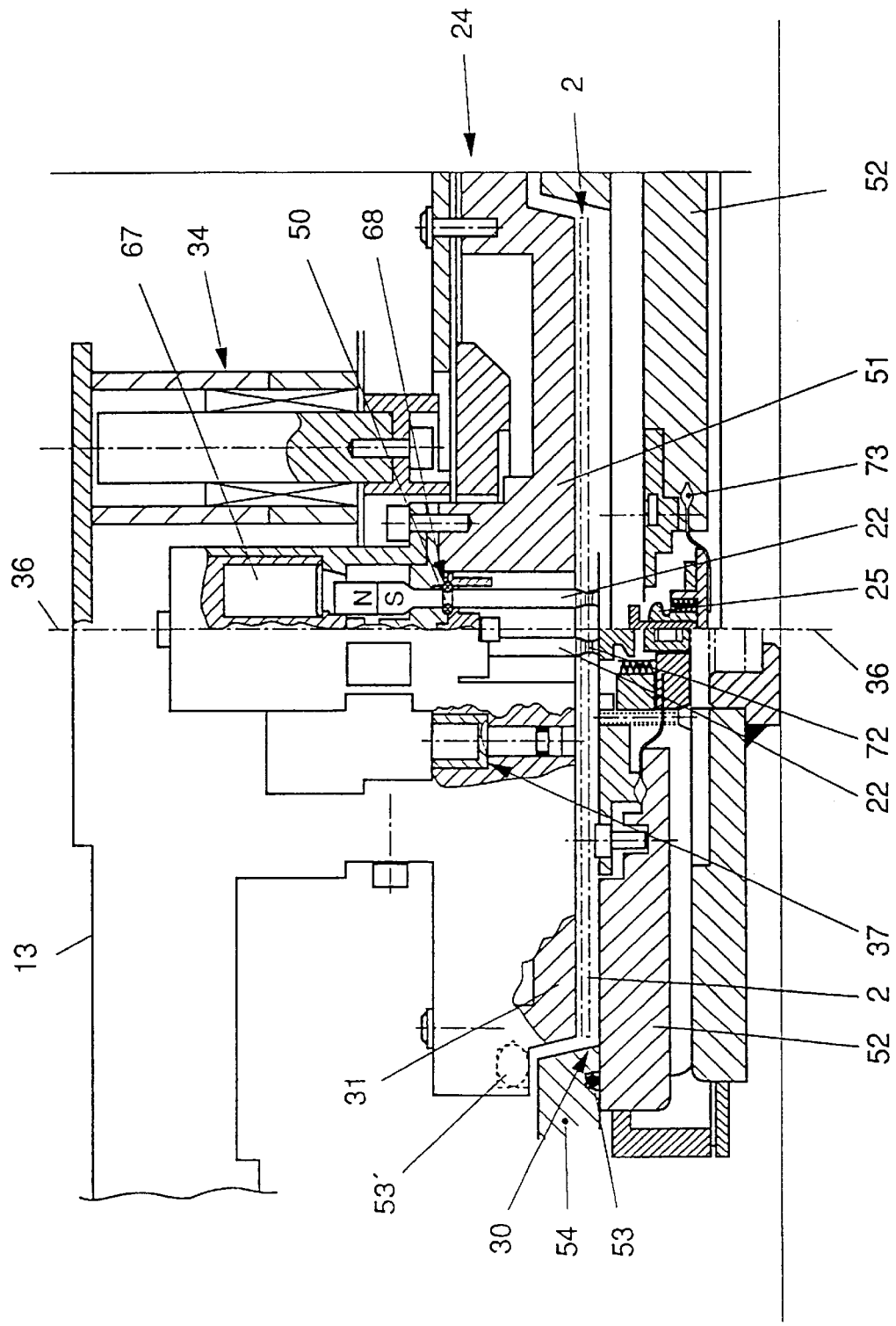
FIG. 2a is an elevational cross-sectional view of a substrate gripper or a gripper arm of a sputtering installation, not represented in the drawings for the sake of simplicity, for conveying substrates or compact disks, wherein a gripper element which can be shifted against the actuation force of a spring is disposed on the lower portion of a bracket.

FIG. 2a shows a specially designed first gripper arm 13 which can be shifted by means of the turntable 12 in a clockwise or counterclockwise direction between the processing stations 3 and 4. In addition to the horizontal shifting of the gripper arm 13, there is the further possibility of shifting the substrate gripping device 24 with its associated gripper elements 22 independently of the lifting movement of the turntable 12. A cam drive, not represented in the drawings, is used for this. Turntable 12 can be moved up and down by a suitable conventional cam mechanism.

The gripper arm 13 represented in FIG. 2a is a feeding mechanism of the sputtering device, not represented in detail in the drawings, of which the gripper arm 13 is a part and by means of which the substrates or CDs 2 are conveyed to a substrate holder 52. Each substrate 2 reaches the processing device 4, in which it is coated.

To this end the gripping device 24 of the gripper arm 13 represented in FIG. 2a has several grippers 22 which are each pivotable around a respective horizontally extending shaft 50 and seated in elastic bearings 68. One shaft 50 which is visible in FIG. 2a is oriented so that its longitudinal axis is perpendicular to the plane of FIG. 2a. The grippers 22 are arranged in a cylinder-shaped housing 51 used for receiving an electromagnet or ring magnet 67, which can be connected with a current supply source, not represented in the drawings. Housing 51 is closed at the top by a cover 31. The electromagnet or ring magnet 67 is used for pivoting the grippers 22 between two stops. In the exemplary embodiment, each gripper 22 carries two permanent magnets at its upper end, an upper magnet identified by N and a lower magnet identified by S. The grippers can be shifted between the two stops by supplying actuating current to the ring magnet 67 and in the process they travel along a path between the represented substrate gripping position and an inclined substrate release position. In the substrate gripping position represented in FIG. 2a, the longitudinal axes of the grippers 22 extend parallel with a longitudinal center axis 36 of the housing 51. The substrate 2 is secured in this position by means of groove-shaped indentations 72 provided on the lower end of the grippers 22.

Only two gripper arms 22 are visible in FIG. 2a. However, it is advantageous to provide three gripper arms, for example, which are offset by respectively 120° relative to each other, so that they can enter into corresponding spaces between substrate grippers 25 of a lower substrate holder 52 located under them. Because of the advantageously arranged spaces in the lower substrate holder 52 it is possible to bring the two devices 24 and 52 very close together and to assure in this way an accurate transfer between the two devices wherein, when the two devices are brought together, the upper grippers 22 briefly enter into the spaces between the lower grippers 25 during the transfer of the substrates 2.

Details of the cooperation between the two devices 24 and 52 and of the structure and operation of the lower substrate holder 52 and its associated gripper mechanism can be found in applications DE 196 05 598.9 and DE 196 05 599.7, pages 20 and 21, which were filed on Feb. 15, 1996 and in my copending U.S. application Ser. No. 08/802,792 entitled SUBSTRATE TRANSPORTING APPARATUS, filed on Feb. 18, 1997 and now U.S. Pat. No. 5,879,121, claiming priority rights based on DE 196 05 599.7 and bearing attorney docket number PD-5235.

If, for example, the substrate 2 is moved by means of the upper device 24 to the lower device, or the substrate holder, 52, schematically represented in FIG. 2a, a lock cover 54 comes to rest sealingly against the front face of holder 52 by means of a seal 53. In the process a lock chamber 30 is formed between the surface of the substrate gripping device 24 and the underside of lock cover 54, which can either be flooded or evacuated for establishing a pneumatic fluid pressure by means of lines, not shown in the drawings, when this is necessary for running the process. The lock cover 54 is furthermore sealed by means of a seal 53 in respect to the holder 52.

The transfer of the substrate 2 from the upper device or the grippers 22 to the lower device or the substrate grippers 25 when chamber 30 is isolated by seal 53 and is performed in the following operational steps:

First a valve, not shown in the drawings, is opened and the lock chamber 30 is evacuated by means of a pump, not represented. By means of this a pressure equalization is created between the top and underside of the substrate holder 52. In this state, the central part of a diaphragm 73 takes up a raised position in which the substrate grippers 25 are pivoted toward the outside and in the course of this hold the substrate 2 which was previously conveyed by grippers 22. For this purpose, the ring magnet 67 is triggered at the same time and pivots the grippers 22 into inclined positions, in the course of which the upper ends of the grippers 22 come to rest against appropriate stops and in the process release the substrate 2. The substrate holder 52 can now be shifted into a lower position shown at the right-hand side of FIG. 2a, while simultaneously the substrate holder 52 is moved downward by means of the diaphragm or the connecting elements, until the substrate holder comes to rest against a stop of turntable 12. The substrate holder 52 with the substrate can now perform a pivot movement without a relative movement occurring between the substrate holder and the turntable.

Following this operational step the next gripping device 24 carried by a gripper arm 13' takes up the previously described position, for which purpose the substrate holder 52 is moved back upward until it rests against seal 53 and closes the lock chamber 30. In the course of this shifting process the substrate 2 remains in the grippers 25 until an appropriate valve, not represented in the drawings, is opened and the lock chamber is flooded, so that atmospheric pressure prevails in the lock chamber. Because of this the required differential pressure $P_d$ is generated between the top and the underside of the substrate holder 52, and the associated diaphragm 73 moves downwardly further into the vacuum chamber, in the course of which the associated grippers 25 are pivoted into inclined positions. The substrate 2 is released by this. It is now simultaneously possible to also trigger the grippers 22 of the upper device, so that they are pivoted out of their inclined positions into vertically extending positions and in the process grip the substrate 2. The substrate 2 can now be lifted and the next substrate can be brought into the described position by pivoting turntable 12.

Figure 2B:
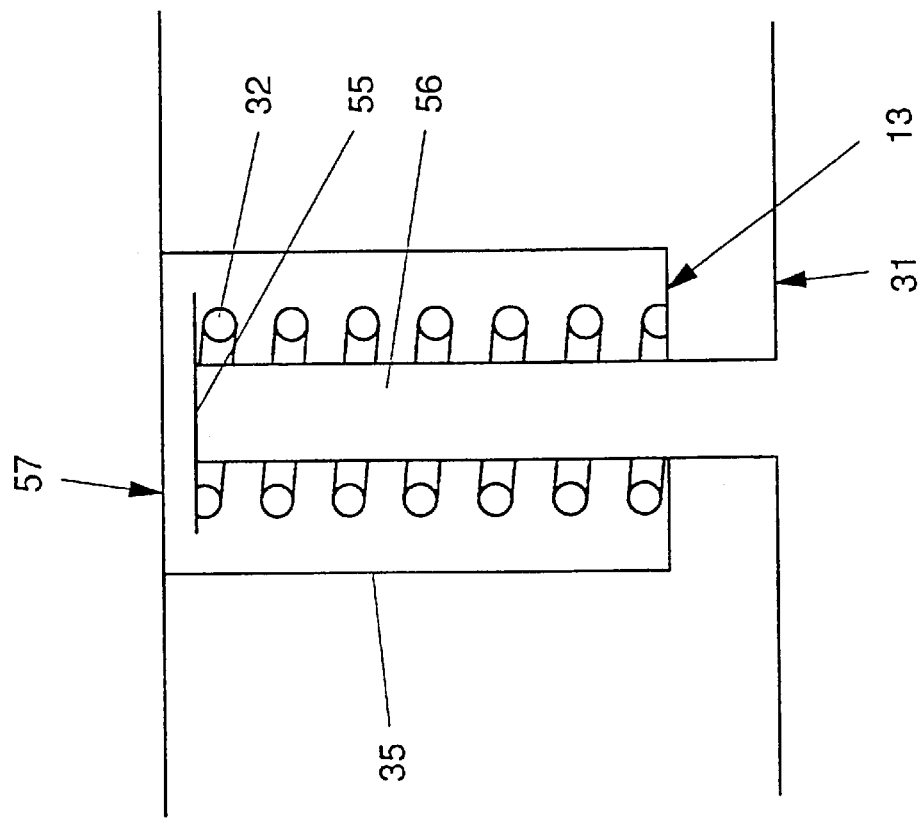
FIG. 2b is a partial view of a substrate holder which is displaceably seated in a gripper arm.

In the exemplary embodiment in accordance with FIG. 2a, the substrate gripping device 24 can be shifted together by means of the turntable 12 in the horizontal and vertical directions, as will be further explained with reference to FIG. 2b, independently of the remaining gripper arms 13' to 13'''.

Reverting to FIG. 1, the horizontally extending plane of movement or movement direction of the gripper arms 13, 13', etc., extends parallel with the plane of movement or surface of the turntable 12 or the base of the device 1 and in the process intersects the axis of rotation 11 of the turntable 12 at approximately right angles. As shown generally in FIG. 2a and in greater detail in FIG. 2b, shifting of a substrate gripping device 24 along its center axis 36 is performed by means of a lifting device 34 which consists of a hollow cylinder 35 connected to the gripper arm 13 and a spring 32 which is received in the cylinder 35 and rests with its upper end against a stop 55 fixed to the upper end of a piston 56 and with its lower end against the bottom of cylinder 35. Piston 56 is guided in the cylinder 35 and is rigidly connected by its lower end with the cover 31 of housing 51. Upward movement of the piston 56 is limited by a stop 57 fixed to gripper arm 13.

If, for example, the turntable 12 with all gripper arms 13 to 13''' is to be lifted, the cover 31 and housing 51 can be retained in the position represented in FIG. 2a by operation of lifting device 34 so that the required vacuum pressure in the lock chamber 30 is maintained when the lower substrate holder 52 moves the substrate 2 on to the processing device 4 (FIG. 1). Thus, by means of the lifting device 34, decoupling of the substrate gripping device 24 from the remaining portion of the gripper arm 13 is achieved when the latter must be shifted upward and the substrate gripping device 24 is intended to remain in the position closing the lock chamber 30.

In the course of a lifting movement of the gripper arm 13, the substrate gripping device 24 remains in its lower position and in the process is held by means of the vacuum pressure being built up in the lock chamber 30. The vacuum pressure acts on the substrate gripping device 24 or cover 31 and presses it on the receptacle or chamber lid, so that the substrate 2 which was picked up off the turntable can be moved on to a cathode of device 4.

However, if the lock chamber 30 is flooded, the substrate gripping device 24 can be shifted by means of one or several lifting devices, wherein the spring 32 automatically moves the piston 56 provided in the cylinder 35 upward until the upper end of piston 56 comes to rest against stop 57 of the gripper arm 13 and therefore the gripping devices of the gripper arms 13 to 13''' are in a raised position and the turntable 12 can turn the individual gripper arms 13 to 13''' into the desired next processing station, whereupon another substrate transfer can take place as already described. One or more of arms 13, 13', etc., can be moved up and down by a conventional hydraulic system (not shown).

In the course of the subsequent operating step or the substrate transfer, a housing 51 is again brought into contact with the substrate holder 52 and the substrate gripping device 24 is maintained in the lower position by means of the appropriate evacuation of the lock chamber 30. Following renewed lifting of the gripper arm 13, the housing 51 is not taken along, so that the spring 32 is compressed by means of the gripper arm 13. The actuating force of the spring 32 stored in this manner is sufficient for moving housing 51 upward when the lock chamber 30 is flooded again following the end of the operating step.

By means of the advantageous design it is achieved that gripping device 24 on the gripper arm 13 assigned to the cathode can be shifted by means of the lifting device independently of the remaining gripper arms. Thus if, as already mentioned, in the first position or transfer position of the substrate between a gripping device 24 and the lock chamber 30 of the coating installation, the substrate is inserted into the lock chamber, the housing 51 disposed in the gripper arm can remain vacuum tight on the lock chamber, and by means of uncoupling of the plate from the gripper arm the gripper arm 13 alone can be shifted upward, while the differential pressure $P_d = P_a - P_v$ occurring in the lock chamber keeps housing 51 on the lock chamber.

The remaining plates or associated griping devices 24 at the individual work positions, which are fixedly connected with their gripper arms 13' to 13''', are also shifted upward by the lifting process, so that they can be turned by means of the turntable and in this way can be shifted into their new operating positions. However, any number of substrate gripping devices 24–24''' can be associated with a lifting device 24.

The substrate exchange at the individual processing positions is not hampered during this operating step. If the lock chamber 30 of the first substrate gripping device 24 is flooded again, housing 51 can spring upward under the force of the spring 32 of the lifting device, so that the gripper arm 13 can be returned into its base or entry position 3.

FIG. 1 also shows a dual inspection device which is located at the processing station 7. The gripper arm 13''', which is designed in an L-shape and represented in the area of the processing station 7, is connected at one end with the turntable 12 and can be shifted in respect to the axis of rotation 11 of the turntable 12 in a vertical direction or in the direction of the lifting movement of the turntable 12, if the turntable 12 is moved up or down. On its outer or free end, the gripper arm 13''' has a bracket 42, which is disposed at approximately right angles and lies on an arc of a circle, wherein the radius diameter R45 of this arc of a circle approximately corresponds to the movement path of the free end of the bracket 42 or to the movement path of the axes of the substrate gripping devices 24.

As already mentioned, the L-shaped gripper arm 13''' can be shifted simultaneously with the turntable 12. Furthermore, it is also possible for the gripper arm 13''' to be shifted by means of an appropriate actuating device, for example an eccentric drive mechanism shown schematically at 39, between the first delivery station 9 and the second delivery station 10. For this purpose the eccentric drive 39, part of which can be a hydraulic cylinder, is connected at one end with the bracket 42 and at the other end with the turntable 12. The substrate gripper arm 13''' can be shifted in this way from the position shown in FIG. 1, in which the substrates are transferred from the checking station 7 and, following an appropriate pivot movement of the substrate gripper arm 13''', are pivoted to the position 9, i.e. the first delivery station, in order to deposit them on a turntable 58 as substrates 2 found to be perfect. By means of the eccentric drive 39 the L-shaped substrate gripper arm 13''' can also be pivoted to the position 10 or the second delivery station, wherein a substrate transported by gripping device 24' is deposited on a turntable 59.

The bent bracket 42 is arranged in accordance with FIG. 1 in such a way that it can move around or reach around a support column of the scanning device for detecting the lacquer layer or the color print, indicated by the position 7, so that a collision between these two device elements 7 and 42 is prevented. If the substrate is shifted from the processing station 6 (lacquer drying) into the checking device or scanning position 7, for example by means of the gripper arm 13''' and the associated substrate gripping device 24' or 24''', a first opportunity is provided for checking the lacquer for defects by means of the scanning device 7, only schematically indicated in the drawings.

All substrates 2, which have not been found to be perfect in the preceding scanning process, can already be picked up at this position by means of the substrate gripping device 24' of the gripper arm 13''' and taken to the second delivery position 10.

The L-shaped gripper arm 13''' can be shifted between the processing station 7 and the processing station 9 or 10. To this end, the bracket 42 has in an advantageous manner the first substrate gripping device 24''' on its outer end, and on its inner end or the angle position of the gripper arm 13''' the second substrate gripping device 24'. A substrate 2 is transferred to the substrate plate 58 by means of the substrate gripping device 24''', and to the receiving plate 59 by means of the substrate gripping device 24'.

Substrates, or CDs, 2 which have been found to be perfect in the station 7 can be gripped by means of a double-armed gripper arm 46, which can be pivoted into a first position of rest 60 and a second position of rest 62 as well as into a work position 63. Gripper arm 46 carries two substrate gripping devices 47, one at each end of arm 46.

The outer end of the gripper arms 13 to 13''' with the substrate grippers 24, etc., move on the radius of the circle R45, and the outer end of the double gripper arm 46 moves on a radius of the circle R48. As can be seen in FIG. 1, the two circle radii 45 and 48 intersect, so that in the inactive position or in the rest position 60 and 62 of the double gripper arm 46, devices 47 must be moved clear of the radius of the circle R45 so that they do not collide with the gripper arm 13''' or its substrate gripping devices 24', 24'''. It is also important that in the course of a shift of the double gripper arm 46 into the position 63, the L-shaped arm 13''' can also be pivoted away in a clockwise direction, so that the arm 46 can be pivoted into the dashed position 63. If the double gripper arm 46 is in its intermediate position, the L-shaped arm can be shifted. The L-shaped arm 13''' must also be shifted in a clockwise direction for unblocking the view of the lacquer checking device from above on the CD to be checked. Therefore the double gripper arm 46 can be shifted from the first rest position 60, shown in solid lines, into the substrate transfer position or work position 63 and in the process pivots through an angle of approximately 60°. In the work position 63 a substrate gripping device 47 of the double gripper arm 46 grips the substrate 2 in the processing station and takes the perfect substrate 2, which was already checked there for lacquer defects and disk quality, from the processing station 7 following a pivoting of the double gripper arm 46 through an angle of 180° to the processing station 8, in which the printing or coloration device is located. In the course of the pivot movement from the first rest position 60 into the work position 63, and then over 180° in a clockwise direction into the transfer position, the substrate 2 picked up in the processing station 7 is transferred to the printing station or coloration station 8, and simultaneously an already printed substrate 2 is brought by means of the other gripping device 47 and deposited there. Following this pivot process, the double gripper arm 46 is brought into its second rest position 62 (shown in dashed lines). Gripping devices 47 may have the same structure as gripping device 24.

After the substrate exchange, the now printed substrate can now also be checked on the second side, in the course of which it is determined whether perfect disk quality exists. A check of the underside of the CDs is therefore also made and detects scratches possibly made during printing.

During the second transfer of a substrate 2 between the processing station 7 and the processing station 8, the substrate exchange is performed by means of the reversed course of the pivot movement of the gripper arm 46. The gripper arm is now pivoted in a clockwise direction out of the rest position 62, shown in dashed lines, into the work position 63 and there picks up the substrate 2 at the processing station 7, and the other gripper arm picks up the printed substrate at the processing station 8. The substrate gripper arm 46 now turns in a counterclockwise direction through 180° and in the process performs the substrate exchange as already described. In this way it is possible to scan an already printed substrate and to provide a not yet printed substrate with an imprint.

The length of the process can be shortened by means of this dual inspection device, which in an advantageous manner is arranged at the periphery of the turntable 12, and a flawless transfer of the substrates 2 between the two position 7 and 8 can be performed, and at the same time the substrates can be moved on by means of the substrate gripper arm 13''' either to the delivery station 9 or 10.

The eccentric drive 39 is also disposed on the turntable 12 and, as already mentioned, is used for shifting the substrate gripper 13''' between the process stations 9 or 10 and the scanning position 7.

As already shown at the outset, it is possible by means of the advantageous device of FIG. 1 to perform a rotating and a lifting movement of the turntable by means of a gear or cam gear, not represented in the drawings, together with a step motor, so that it is possible to omit the lift cylinders, customary up to now, for the individual gripper arms 13 to 13'''. Because of the possibility of moving the substrate gripping device 24 vertically relative to first gripper arm 13, it is possible to perform a lifting movement of all gripper arms by means of a single actuating device, namely by means of the turntable 12, so that the substrate exchange at the individual processing stations can take place unhindered. It is possible to make do with only four to five substrate grippers for this device, so that the device becomes less expensive because of this. In the exemplary embodiment of FIG. 1, the turntable 12 is equipped with only four substrate gripper arms, three of which consist of a straight element and the fourth of an L-shaped element. It is possible by means of these gripper arms 13 to 13''' to assume a total of seven different positions (entry position 3, coating position 4, lacquering position 5, drying position 6, scanning position 7 and two delivery stations 9, 10). The cycle time as a whole as well as the number of shift elements is reduced to a minimum by means of this.

The grippers 22 can be embodied as suction elements, or can grip the substrate 2 in the center bore or at the outer edge by means of an indentation on their end.

Each substrate gripping device 24 can be further provided with a sensor 37, as shown in FIG. 2a, for detecting the presence of a substrate 2.

This application relates to subject matter disclosed in German Applications numbers 196 06 763.4 and 196 06 764.2, both filed on Feb. 23, 1996, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An apparatus for transporting substrates, said apparatus comprising: a plurality of stations including an entry station, several processing stations and at least one receiving station, the stations being arranged along a path; a turntable rotatable about a vertical axis and moveable vertically along the vertical axis; a plurality of gripper arms mounted on said turntable for movement with said turntable, each gripper arm having a free end remote from the turntable axis; and a plurality of substrate gripping devices each mounted at the free end of one of said gripper arms and each having substrate gripping means for releasable holding a substrate, wherein at least one of said gripper arms is movable in at least one direction relative to said turntable, and one of said substrate gripping devices can be shifted at least in a direction parallel to said vertical axis independently of the remaining gripper arms.

2. The apparatus in accordance with claim 1, wherein one of said substrate gripping devices further comprises means for moving said substrate gripping means of said one of said substrate gripping devices relative to the gripper arm on which said one of said substrate gripping devices is mounted at least in the direction of a lifting movement of said gripper arm independently of the lifting movement of said gripper arm.

3. The apparatus in accordance with claim 1, further comprising an actuating device coupled to at least one of said gripper arms for shifting said at least one of said gripper arms in a plane of movement which intersects the vertical axis of said turntable at approximately right angles, wherein said at least one of said gripper arms can be shifted by means of said actuating device opposite to the direction of movement or in the direction of movement of said turntable in a horizontal plane of movement.

4. The apparatus in accordance with claim 3, wherein said actuating device is an eccentric drive element having a first end connected to said turntable and a second end, remote from said first end, hingedly connected to said at least one of said gripper arms.

5. The apparatus in accordance with claim 1, wherein: said at least one receiving station comprises two receiving stations; said plurality of gripper arms consist of four gripper arms; and said at least one of said gripper arms is a fourth gripper arm which is movable between said two receiving stations.

6. The apparatus in accordance with claim 1, wherein said at least one of said gripper arms has a main arm portion which extends in a radial direction from the vertical axis of said turntable and which has an outer end remote from the vertical axis, and a bracket which extends from said outer end at an approximately right-angle to said main arm portion; and at least two of said substrate holders are carried by said bracket.

7. The apparatus in accordance with claim 6, wherein said bracket has a circular arcuate form with a radius of curvature concentric with the vertical axis.

8. The apparatus in accordance with claim 6, further comprising an additional gripper arm spaced from said turntable at a location to cooperate with said at least one gripper arm, and mounted for rotation about a second vertical axis independently of said turntable.

9. The apparatus in accordance with claim 8, wherein said additional gripper arm is a double-armed gripper arm having two outer ends remote from second vertical axis, and said apparatus further comprises first and second additional substrate gripping devices each mounted at a respective one of said two outer ends of said additional gripper arm.

10. The apparatus in accordance with claim 9, wherein: said substrate gripping devices carried by said plurality of gripper arms are circumscribed by a first circle concentric with the vertical axis of said turntable; said two additional substrate gripping devices are circumscribed by a second circle concentric with the second vertical axis; said double-armed gripper arm is pivotable between a pickup and/or unloading position and first and second rest positions; and the first circle is tangent to or intersects the second circle.

11. The apparatus in accordance with claim 10, wherein said double-armed gripper arm can be pivoted in a first sense from its first rest position into the pickup and/or unloading position, where said first additional substrate gripping device is in a transfer and scanning position for transferring a printed or lacquered substrate to a substrate gripping device carried by said at least one of said gripper arms, while said second additional substrate gripping device is in a transfer and printing position for depositing a not-yet-printed substrate at a printing station, and said double-armed gripper arm can be pivoted from its pickup and/or unloading position to its second rest position.

12. The apparatus in accordance with claim 11, wherein said double-armed gripper arm pivots over a path of more than approximately 240° between said first and second another rest positions.

13. The apparatus in accordance with claim 11, wherein after being subjected to a printing process at the printing station, a printed substrate can be pivoted out of the transfer and printing position by means of said double-armed gripper arm and into the transfer and scanning position after triggering of a pivot movement of said at least one of said gripper arms.

14. The apparatus in accordance with claim 9, wherein: one of said processing stations is a scanning station; said turntable is operable independently of said additional gripper arm; and a substrate gripping device carried by said at least one of said gripper arms and said first and second additional substrate gripping devices are movable to cooperate with said scanning station and pivotable away from said scanning station so that the substrate can be scanned twice in one place in one area.

15. The apparatus in accordance with claim 1, a plurality of said substrate gripping devices can be shifted together with said turntable, and said at least one of said gripper arms can be shifted in at least one of movement direction independently of the remaining gripper arms.

16. The apparatus in accordance with claim 1, wherein one of said substrate gripping devices can be shifted along the vertical axis independently of the other substrate gripping devices.

17. The apparatus in accordance with claim 1, wherein one of said substrate gripping devices can be shifted at least in one movement direction perpendicular to said vertical axis independently of movement of the other substrate gripping devices.

18. The apparatus in accordance with claim 1, wherein a plurality of said gripper arms can be displaced in at least one direction together with said turntable.

19. The apparatus in accordance with claim 1, wherein: one of the processing stations includes a cathode; at least one of said substrate gripping devices further comprises a cover element which is movable with said substrate gripping means and a substrate holder which is movable relative to said cover element, said cover element and said substrate holder being relatively movable toward one another to form a lock chamber; said at least one of said substrate gripping devices further comprises means for establishing a pneumatic fluid pressure in said lock chamber; and said at least one of said substrate gripping devices is movable over a path to bring a substrate to the cathode.

20. The apparatus in accordance with claim 19, wherein: said at least one of said substrate gripping devices further comprises means for producing an actuating force produced by a spring or a pressure medium for urging said cover element away from said substrate holder; said cover element is urged toward said substrate holder when the pneumatic fluid pressure has a sufficiently low value; and said cover element and said substrate holder are movable as a unit by said turntable.

21. The apparatus in accordance with claim 19, wherein said at least one of said substrate gripping devices further comprises means for producing an actuating force for urging said cover element away from said substrate holder, said means for producing an actuating force comprising: a cylinder and a piston movable in said cylinder, each of said piston and said cylinder being connected to a respective one of said cover element and said gripper arm on which said at least one of said substrate gripping devices is mounted, and a spring disposed in said cylinder for urging said piston in a selected direction relative to said cylinder.

22. The apparatus in accordance with claim 19, wherein said at least one of said substrate gripping devices further comprises means for producing an actuating force for urging said cover element in the direction toward said gripper arm.

23. The apparatus in accordance with claim 1, wherein at least one of said substrate gripping devices further comprises at least one sensor for detecting the presence of a substrate.

* * * * *